(12) United States Patent
Aurongzeb et al.

(10) Patent No.: US 8,901,496 B2
(45) Date of Patent: Dec. 2, 2014

(54) OVERHEAD OCCUPANCY SENSOR

(75) Inventors: Deeder Mohammed Aurongzeb, Round Rock, TX (US); David Christopher Shilling, Cleveland, OH (US)

(73) Assignee: General Electric Company, Schenectady, NY (US)

( * ) Notice: Subject to any disclaimer, the term of this patent is extended or adjusted under 35 U.S.C. 154(b) by 29 days.

(21) Appl. No.: 13/528,269

(22) Filed: Jun. 20, 2012

(65) Prior Publication Data

US 2013/0341510 A1   Dec. 26, 2013

(51) Int. Cl.
*G01J 5/20* (2006.01)

(52) U.S. Cl.
USPC ........................................ 250/338.1

(58) Field of Classification Search
USPC ........................................ 250/338.1
See application file for complete search history.

(56) References Cited

U.S. PATENT DOCUMENTS

| | | | |
|---|---|---|---|
| 4,321,594 A | 3/1982 | Galvin et al. | |
| 5,739,753 A | 4/1998 | Porter | |
| 6,222,191 B1 | 4/2001 | Myron et al. | |
| 6,798,341 B1 * | 9/2004 | Eckel et al. | 340/521 |
| 6,987,267 B1 | 1/2006 | Monroe et al. | |
| 7,286,052 B2 | 10/2007 | DiPoala | |
| 7,456,737 B2 | 11/2008 | DiPoala | |
| 7,800,049 B2 | 9/2010 | Bandringa et al. | |
| 2007/0040676 A1 | 2/2007 | Bandringa et al. | |
| 2012/0169507 A1 * | 7/2012 | Dyer et al. | 340/693.11 |

OTHER PUBLICATIONS

Leviton Mfg. Co. Inc. Lighting & Energy Solutions, OSFHU Passive Infrared Fixture Mount High Bay Occupancy Sensor, Jan. 2012, pp. 1-4.
Wattstopper, HBEM3 High Bay Occupancy Sensor Mounting Bracket Extender Module, Apr. 2011, pp. 1-2.

* cited by examiner

*Primary Examiner* — David Porta
*Assistant Examiner* — Hugh H Maupin
(74) *Attorney, Agent, or Firm* — GE Global Patent Operations; Peter T. Dimauro

(57) ABSTRACT

An overhead occupancy sensor assembly includes a housing, a lens disposed in the housing, a sensing element disposed behind the lens and configured to detect light, and a light blocking element, the light blocking element being configured to block light from reaching the sensing element. The light blocking element is a re-shapeable filter element or a rejection pattern of the lens. A continuous range of motion extension adapter may be included to allow optimal positioning of the sensor device for improved detection.

16 Claims, 4 Drawing Sheets

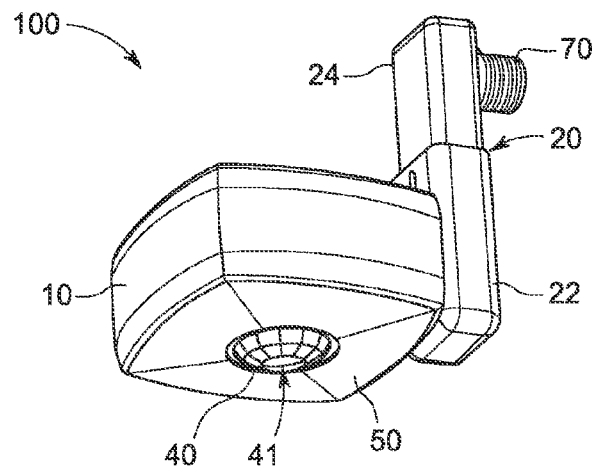
FIG. 1
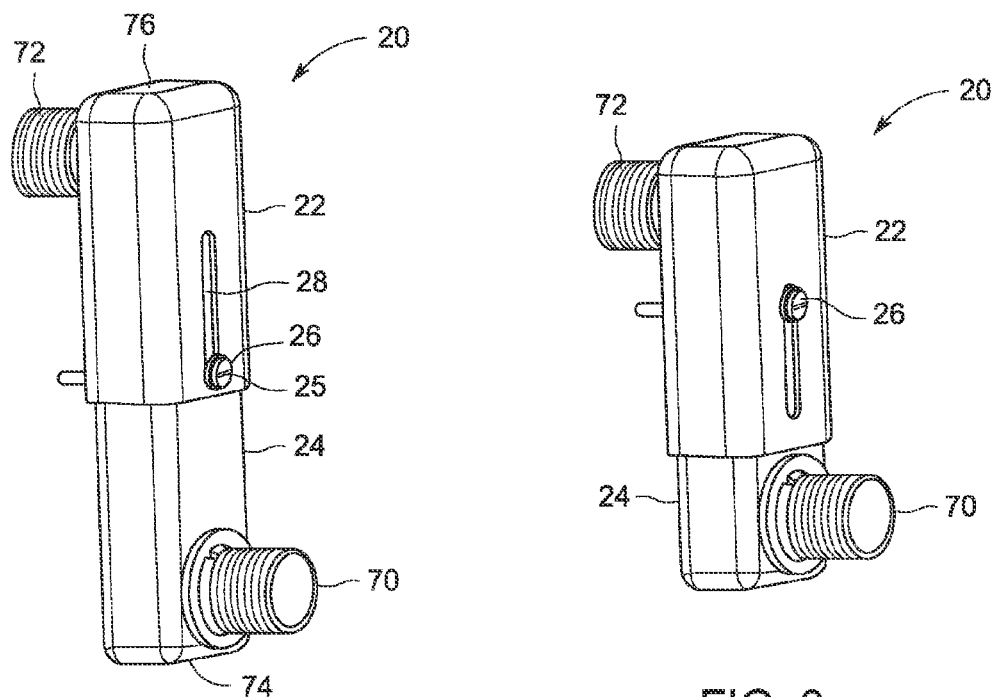
FIG. 2
FIG. 3

OVERHEAD OCCUPANCY SENSOR

BACKGROUND

1. Field of the Invention

The present disclosure generally relates to motion detectors and, more particularly, to an overhead occupancy sensor such as a ceiling-mounted or high bay occupancy sensor.

2. Description of Related Art

Overhead occupancy sensors are lighting control devices used in high mount areas such as commercial and office ceilings, warehouses, aisles, and manufacturing facilities. These types of sensors detect the presence of motion, such as by humans or other objects in a space and, in response to the detection or lack thereof, actuate lighting circuits, turn on or shut off electrical power, control climate regulation systems, and the like. Due to the specific requirements of this arrangement, industry practice is to use passive infrared technology for sensing motion. Overhead occupancy sensors are often attached directly to a standard lighting fixture, such as the industrial T8 or T5 fluorescent lighting fixtures, LED luminaries, or to an electrical junction box by means of an industry-standard ½ inch conduit knockout port. Typically, this lighting fixture is situated on a raised ceiling, giving the sensor a view of a large area of the monitored space. However, if the sensor lens is not below the body of the lighting fixture, the lighting fixture itself will block at least part of the field of view of the sensor. Therefore, these sensors often include extension adapters designed to allow some flexibility in the positioning of the sensor. In addition, these adapters provide a means of running tine-voltage AC wiring to the sensor device without installing additional electrical conduit. These extension adapters typically provide a certain number of discrete sensor placement positions, which may not always correspond to the desired positioning. It would be advantageous to provide an extension adapter that provides continuous-range motion that allows the sensor to be placed at exactly the desired height.

An infrared (IR) filter, also referred to as an IR blocking filter, can be placed adjacent to the lens of the sensor and is typically used to block infrared light or radiation from a certain part of the space, rendering the sensor insensitive to motion in that area. The shape of the filter, which is generally of a fixed shape, can be used to determine the sensitivity pattern of the sensor, such as an aisle or hallway. While the filter itself may be rotatable, these filters are not re-shapeable. Rather, if a different monitoring arrangement is desired, a filter can be replaced with one of another shape.

Typical sensors can also have a radially-symmetric lens that is paired with a separate IR filter to achieve non-symmetric sensitivity. In some cases, the filter is rotatable, but not re-shapeable.

It would be advantageous to provide an overhead occupancy sensor device that has continuous-range-of-motion positioning and flexible filter arrangements to allow for fine positioning of the sensor device to avoid spurious triggering of the sensor from stray light and to present the optimum field of view to the lens of the sensor to capture activity in a desired area.

Accordingly, it would be desirable to provide an overhead occupancy sensor device that addresses at least some of the problems identified above.

SUMMARY OF THE DISCLOSED EMBODIMENTS

As described herein, the exemplary embodiments overcome one or more of the above or other disadvantages known in the art.

One aspect of the exemplary embodiments relates to an overhead occupancy sensor assembly. In one embodiment, the occupancy sensor assembly includes a housing, a lens disposed in the housing, a light sensing element disposed behind the lens, and a light blocking element, the light blocking element being configured to block light from reaching the light sensing element. The light blocking element is a re-shapeable filter element or a rejection pattern of the lens.

Another aspect of the exemplary embodiments relates to an overhead occupancy sensor for coupling to a support fixture. In one embodiment, the occupancy sensor includes a housing, a lens disposed within the housing, a light sensing element disposed within the housing and behind the lens, and an extendable attachment mount coupling the housing to the support fixture. The extendable attachment mount has a first end, a second end and a retention device between the first end and the second end. The attachment mount is configured to provide a non discrete range-of-motion for positioning the housing with respect to the support fixture.

In a further aspect, the exemplary embodiments are directed to an overhead occupancy sensor. In one embodiment, the occupancy sensor includes a housing, a lens disposed in the housing, a light sensing element disposed behind the lens, and a shapeable filtering element disposed between the lens and the sensing element. The shapeable filter element includes a plurality of individual, radially movable segments that form a field of view for the sensing element.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and that, unless otherwise indicated, they are merely intended to conceptually illustrate the structures and procedures described herein. In addition, any suitable size, shape or type of elements or materials could be used.

BRIEF DESCRIPTION OF THE DRAWINGS

In the drawings:

FIG. 1 is a perspective view of an exemplary embodiment of an overhead occupancy sensor device incorporating aspects of the present disclosure.

FIGS. 2-5 are perspective views of embodiments of an attachment mount for an overhead occupancy sensor incorporating aspects of the present disclosure.

DETAILED DESCRIPTION

Figure 4:
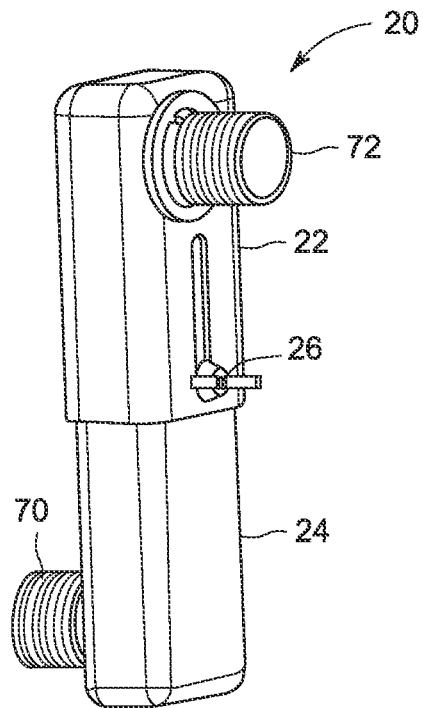

Referring to FIG. 1, an exemplary overhead occupancy sensor device assembly incorporating aspects of the disclosed embodiments is generally designated by reference numeral 100. The aspects of the disclosed embodiments are directed to an overhead occupancy sensor that includes one or more of a light sensor, a shapeable filter, a rotatable, selective filtering lens and a continuous range of motion extension adapter.

As is shown in FIG. 1, the sensor assembly 100 generally comprises a housing 10 and an attachment mount 20. The housing 10 will include a lens 40. In one embodiment, the lens 40 is retained by or in a cover 50. The lens 40 may be a selective filtering lens, such as a lens that passes infrared (IR) light in a portion of the lens and blocks IR light in the remainder of the lens 40. The term "infrared light" as is used herein is generally intended to mean electromagnetic radiation with wavelengths that are longer that the wavelengths of visible light. Generally, "infrared light" as is used herein, will not include the visible light spectrum. Although the aspects of the disclosed embodiments will generally be described herein with respect to filtering infrared light, the aspects of the disclosed embodiments are not so limited, and can include the filtering of visible light. For example, in the case of a video-based occupancy sensor application, it may be desired to filter visible light from certain areas of the occupancy sensor to prevent false triggering of the sensor. In this type of application, the sensor assembly 100 can be configured to provide a suitable selective light filtering scheme or light rejection pattern, other than including infrared light. For example, in one embodiment, the lens 40 can be completely opaque to all light and not just infrared light.

In one embodiment, a light sensing element 41 is generally disposed within the housing 10 behind the lens 40. For purposes of the description herein, the sensing element 41 will be described with respect to a passive, infrared light sensing element that is configured to detect infrared light in order to actuate the sensor 100 in a known manner. In alternate embodiments, the light sensing element 41 can be any suitable light sensing element, including a sensing element configured to detect visible light. In one embodiment, the sensing element 41 comprises a dual-element pyrometer for generating alternating electrical signals in the presence of changes in the coming infrared radiation pattern, as is generally known. The sensing element 41 can also include such other suitable electronics and electrical circuits necessary for the proper sensing of light and operation of the occupancy sensor assembly 100 described herein.

The housing 10 is suitably attached to the attachment mount 20, which in the embodiment shown in FIG. 1 includes a connector 70, such as threaded connector, for attachment of the sensor assembly 100 to a fixture box, electrical box, or lighting fixture. In alternate embodiments, the attachment mount 20 can include any suitable means for attaching or securing the sensor assembly 100 to a desired location or device. While the housing 10 and attachment mount 20 are shown as separate elements configured to be secured together, in one embodiment the housing 10 and attachment mount 20 can comprise an integrated assembly or unit. In one embodiment, the sensor 100 does not include an attachment mount 20, in which case the sensor 100 is configured to be attached directly to a fixture, such as a light fixture or a knock out port of an electrical junction box. In this case, the sensor assembly 100 can include a male-to-male connector to attach the sensor assembly 100 directly to a light fixture or electrical knockout ports.

When the sensor assembly 100 includes an attachment mount 20, in one embodiment, the attachment mount 20 can be coupled to the sensor assembly 100 using a knockout port on housing 10 of the sensor assembly 100. The connector 70 can be used to couple the attachment mount 20 to the light fixture or electrical outlet, or other suitable structure.

In one embodiment, the attachment mount 20 includes a fixed portion 22 and a moveable portion 24. The fixed portion 22 is secured to, or part of the housing 10. The moveable portion 24 and the fixed portion 22 are configured in a telescoping manner such that the attachment mount 20 has extendable length and can include the connector 70. The fixed portion 22 and the movable portion 24 are coupled together in an extendable arrangement that provides a continuous or non-discrete range-of-motion of the sensor assembly 100 relative to the fixture or other mounting location to which it is secured. Although the embodiment in FIG. 1 describes the fixed and movable portions of the attachment mount 20 with reference to elements 22 and 24, in alternate embodiments the element 22 can comprise the movable portion while the element 24 can comprise the fixed portion.

Figure 5:
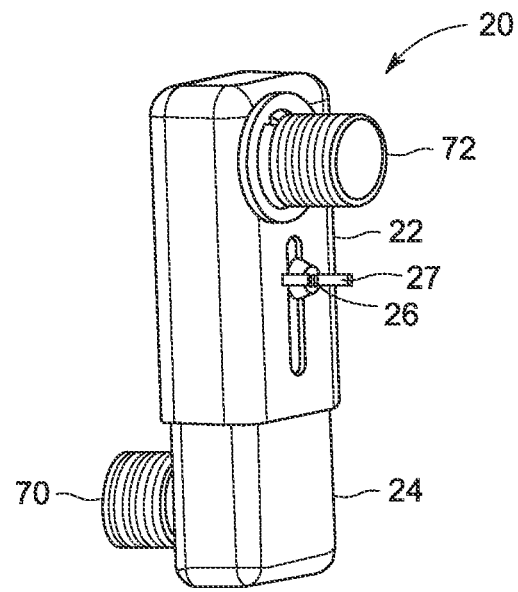

FIGS. 2-5 illustrate embodiments of the attachment mount 20 in extended and retracted positions. FIGS. 2 and 4 illustrate perspective views of the attachment mount 20 in an extended position, while FIGS. 3 and 5 show the attachment mount 20 in a retracted position. As is shown in FIGS. 2-5, in this embodiment the attachment mount 20 is configured as a two piece assembly 22, 24, with a first end 74 configured to be affixed to a support such as a light fixture and a second end 76 configured to be affixed to, or part of, the housing 10. As noted, the positioning of the ends 74, 76 could be reversed relative to the mounting structure and housing 10.

In one embodiment, each end 74, 76 includes a respective connector 70, 72. The connectors 70, 72 may be threaded or include a suitable connection mechanism for coupling the end 74, 76 to its respective structure. In one embodiment, each connector 70, 72 is configured to be received and secured in a knockout port, as is commonly understood. The attachment mount 20 provides a continuous range of motion of a length of travel, which in this embodiment is defined by channel or slot 28. In this embodiment, a retention device 26 is used to slidingly engage the fixed and movable 22, 24 portions of the attachment mount 20. The retention device 26 can be loosened to allow the portions 22, 24 to move relative to one another and tightened or secured to prevent further movement of the portions 22, 24. This configuration allows the housing 10 to be moved to or positioned in substantially the exact desired location or position.

In one embodiment, the retention device 26 comprises a threaded rod or pin 25 and nut 26 assembly. The rod 25 is configured to slidingly engage the slot 28 on each of the fixed and movable portions 22, 24. In alternate embodiments, the retention mechanism 26 comprises any suitable device that allows the portions 22, 24 to be slidingly engaged and retained in a fixed position when the housing 10 is positioned in the desired location relative to its mounting location.

In one embodiment, referring to FIGS. 4 and 5, the retention mechanism 26 is a screw or bolt and a nut 27 is used to retain the portions 22, 24 in a fixed position. FIG. 4 illustrates the attachment mount 20 in an extended position, while FIG. 5 illustrates the attachment mount 20 in a partially retracted position. In alternate embodiments, the attachment mount 20 can include any known telescoping mechanism that allows the attachment mount 20 to be extended and retracted. This can include threaded tubes and twist-locking retention devices.

Figure 6:
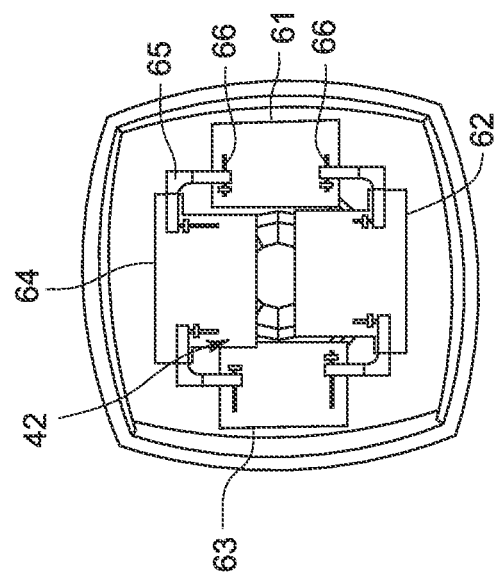
FIGS. 6-7 are top views of an embodiment of a filter assembly for an overhead occupancy sensor incorporating aspects of the present disclosure.

Referring to FIG. 6, in one embodiment, the housing 10 includes a shapeable, or re-shapeable, infrared (or other selective light) filter 60 for the lens 40 shown in FIG. 1. In one embodiment, the filter 60 is a separate element from the lens 40. The filter 60 generally comprises a material, such as a blocking material that renders the sensor 41 insensitive to motion in one or more areas of its field of view. Most commonly, the filter 60 will be constructed of thermoplastic of sufficient thickness so as to provide adequate infrared blocking. In one embodiment, the filter 60 is configured to allow the field of view of the sensor 41, and in particular the lens window 42, to be narrowed and widened depending upon the particular application. For example, in a store or warehouse application, it may be desirable to use the sensor assembly 100 to monitor a more confined area such as an aisle. In such an application, it can be desirable to limit the field of view of the sensor 41 to the area being monitored, the aisle. The aspects of the present disclosure advantageously allows a single filter to be used for multiple applications by allowing the filter to be shapeable, or re-shaped, without the need for rotating or replaceable parts.

In the embodiment shown in FIG. 6, the filter 60 is made up of several segments, which in this example are shown as segments 61, 62, 63 and 64. In alternate embodiments the filter 60 can comprise any suitable number of segments, other than including four. The segments 61-64 are movable, and can positioned to adjust the sensor coverage area. Each segment 61-64 is capable of motion along at least one axis, but is generally not capable of rotation. The filter 60 can be reshaped by adjusting the position of at least one of the segments 61-64. The segments 61-64 move along the radial direction either by extending or sliding in a continuous manner or in discrete steps.

Figure 7:
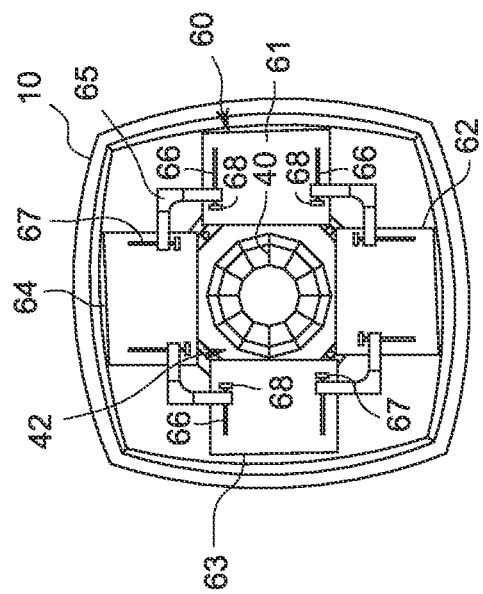

In the embodiment shown in FIG. 6, the shape of each segment 61-64 is substantially rectangular, although in alternate embodiments, any suitable shape can be used. In one embodiment, the light rejection pattern provided by the filter 60 is determined by the position of each of the filter segments 61-64. In the example shown in FIG. 6, the filter segments 61-64 do not obscure or block any portion of the lens 40, and the lens window 42 provides maximum coverage area for the sensor assembly 100. In the embodiment of FIG. 7, the filter segments 61-64 have been moved or positioned to block the side portions of the lens 40, relative to the example shown in FIG. 6.

Figure 8:
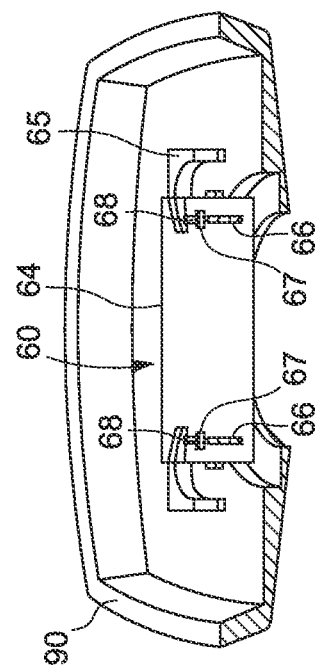
FIG. 8 is a cross-sectional view of the filter assembly of FIG. 6.

As shown in FIGS. 6-8, each segment 61-64 is arranged on a pair of tracks 66, which allows the segments 61-64 to be slidingly moved inwards and outwards. Each segment 61-64 is held in place by an interference fit with a pair of locating clips 65. The locating clips 65 provide sufficient pressure so as to prevent unintended movement of the segments 61-64 without preventing adjustment of the position of each segment 61-64. As shown in FIG. 6, each segment 61-64 includes a pair of guides 68 that move along or within the corresponding track 66 cut into the segments 61-64 so as to limit the radial motion of the segment 61-64. In one embodiment, each segment 61-64 is made of a plastic material that can be installed onto the guide pegs 68 through the widened notches 67 during manufacturing assembly. In one embodiment, the segments 61-64 can be moved individually along the guides 68, or the segments 61-64 can move uniformly together, or in unison. In one embodiment, pairs of the segments, such as the pair 61 and 63 or 62 and 64 can be configured to move in unison, or as a unit.

In the example of FIG. 1, the lens window 42 has been narrowed from the embodiment in FIG. 6, and provides a more narrowed or more focused coverage area. In the example of FIG. 7, the coverage area could be an aisle area. FIG. 8 illustrates a cross-sectional view of the assembly shown in FIG. 6.

In one embodiment, the lens 40 is configured as a partially blocking lens, where light rejection pattern or light blocking is a characteristic of the lens itself. In the case of a typical PIR sensor, the sensor has a lens that is configured to focus incoming radiation from all directions directly onto the dual-element pyrometer. Separate filter devices can be used to block light from unwanted directions. The aspects of the disclosed embodiments allow the lens 40 to be configured to provide a light blocking or rejection pattern that blocks or rejects incoming light from certain, pre-defined angles.

Figure 9:
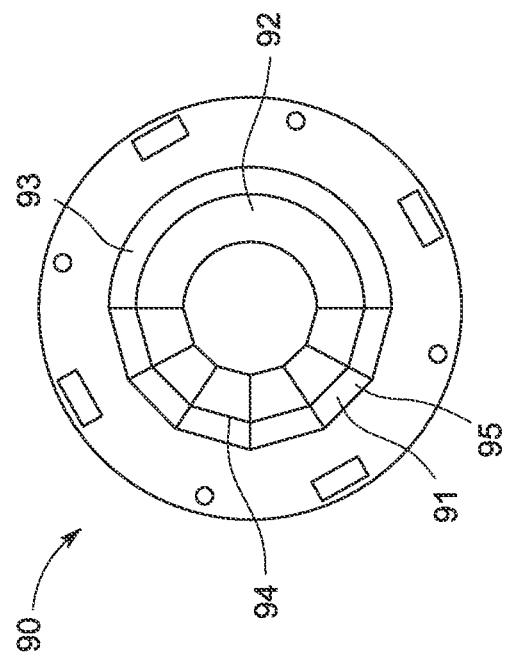
FIG. 9 is a perspective view of one embodiment of an infrared blocking filter for an overhead occupancy sensor incorporating aspects of the present disclosure.

FIG. 9 illustrates an embodiment of a lens 40 incorporating aspects of the disclosed embodiments that is configured as a partially light blocking lens 90. In this embodiment, the light rejection pattern provided by the lens 90 is formed by nature of a focal pattern which directs unwanted infrared light away from the sensing element 41 shown in FIG. 1. For example, as illustrated by the exemplary lens 90 shown in FIG. 9, the infrared light transmittance, transparency, of infrared focusing characteristics of the lens 90 are not radially symmetric. Some regions of the lens 90 block the transmission of infrared light or do not focus that infrared light on the sensing element 41 illustrated in FIG. 1, while other regions of the 90 lens transmit and locus the infrared light. In one embodiment, a first region 92 of the lens 90 can have an infrared transmittance or focal pattern, also referred to herein as a light rejection pattern, different from an infrared transmittance or focal pattern of a second region 94.

Referring to FIG. 9, in one embodiment, the light rejection pattern of the lens 90 is formed by using an IR-blocking coating 95 placed on one or more regions of the lens 90. In the embodiment of FIG. 9, a region 91 of the lens 90 includes a light blocking coating 95, while region 93 lacks a light blocking coating. Lens transparency may be altered with a coating, material gradient, Fresnel pattern, or other suitable coating and patterning techniques. In this example, the regions 91 and 93 area approximately one-half of the area of the lens 90. In alternate embodiments, each region 91, 93 can comprise any suitable area of the lens 90. Alternate embodiments may be suited for corner-mounted sensors, with 90-degree sensitivity patterns, or commercial spaces, with sensitivity matching the shape of a commercial aisle way, for example. In another embodiment, one or more of the different regions 91-94 of the lens 90 can have different material make-ups, where the different regions 91-94 can be arranged and patterned in a desired manner to reject unwanted light. Different rejection patterns and combinations of rejection patterns can be implemented in the sensor assembly 100 of the disclosed embodiments.

In one embodiment, the lens 90 is rotatable and can be suitably adjusted so that the portions of the lens 90 that block infrared light is suitably positioned with respect to the sensor 41 shown in FIG. 1. In one embodiment, a kit including an overhead occupancy sensor device assembly 100 of the disclosed embodiments can include a variety of different lenses 40 with various light blocking or rejection patterns. This allows the selection of a suitable lens for the specific use application.

Generally, if the lens 40 is configured to perform light blocking as described above, a separate filter such as the re-shapeable filter 60, may not be necessary. Similarly, if a re-shapeable filter 60 were used, the lens 40 would not need to be configured with light blocking or rejection capability. Alternatively, lens arrangements and combination of lens arrangements that partially block light other than the arrangement of FIG. 9 are contemplated by the aspects of the present disclosure.

In another embodiment, the lens 40 is configured to reject a desired range of infrared light by nature of a focal pattern which directs unwanted radiation away from the sensing element 41. In another embodiment, the lens 41 rejects unwanted radiation by nature of its material composition in certain regions.

Examples of embodiments of installation and use methods for the overhead occupancy sensor device of the present disclosure can include attaching the occupancy sensor device to a support such as a light fixture. In these embodiments, the occupancy sensor device comprises the lens 40 and sensing element housing 10 and an attachment mount 20, also referred to as an extension adapter. The housing 10 can include one or more of a lens 40, re-shapeable filter 60 or a light blocking lens 90. The attachment mount 20 can be used to provide a continuous range of motion displacement between the housing 10 and the fixture or support to which the attachment mount is attached. The re-shapeable filter 60 is configurable to adjust the coverage area of the lens 40 and sensing element. When the lens 40 is a light blocking lens 90, the light blocking lens 90 can pattern different portions of the lens itself to provide infrared transmission and blocking regions.

The aspects of the disclosed embodiments are directed to an enhanced overhead occupancy sensor. The filter designs of the sensor of the disclosed embodiments are flexible and can be adapted for different uses, installations and applications. A shapeable filter can be used to block light from reaching the light sensor, while the lens itself can be configured include a light rejection pattern that rejects light from certain regions and angles. Being able to rotate the lens allows for the creation and use of different rejection patterns. The attachment and extension aspect of the sensor of the disclosed embodiments provides for continuous range of motion when positioning the sensor device.

Thus, while there have been shown, described and pointed out, fundamental novel features of the invention as applied to the exemplary embodiments thereof, it will be understood that various omissions and substitutions and changes in the form and details of devices illustrated, and in their operation, may be made by those skilled in the art without departing from the spirit of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An overhead occupancy sensor assembly, comprising:
   a housing;
   a lens disposed in the housing;
   a light sensing element disposed behind the lens;
   a light blocking element, the light blocking element being configured to at least partially block light from reaching the sensing element, wherein the light blocking element is a re-shapeable filter element disposed between the lens and the sensing element, the re-shapeable filter element comprising a plurality of individual, radially movable segments;
   and
   an extendable attachment mount coupled to the housing, the extendable attachment mount configured to provide a continuous range-of-motion for positioning the housing with respect to a support fixture.

2. The occupancy sensor assembly according to claim 1, wherein the movable segments are individually movable between the lens and the sensing elements.

3. The occupancy sensor assembly according to claim 1, wherein the movable segments form opposing pairs of movable segments, each pair moving in unison.

4. The occupancy sensor assembly according to claim 1, wherein the light sensing element is an infrared light sensing element and the light blocking element is configured to block infrared light.

5. The occupancy sensor assembly according to claim 1, the extendable attachment mount being a slidable attachment comprising a first end and a second end, and a slidable retention device between the first end and the second end, the first end being coupled to the housing and the second end being coupled to the fixture.

6. An overhead occupancy sensor, comprising:
   a housing;
   a lens disposed in the housing;
   a light sensing element disposed behind the lens; and
   a shapeable filtering element, disposed between the lens and the sensing element, the shapeable filter element comprising a plurality of individual, radially movable segments that form a field of view for the sensing element.

7. The occupancy sensor according to claim 6, wherein the movable segments are individually movable.

8. The occupancy sensor according to claim 6, wherein the movable segments form opposing pairs of movable segments, each pair moving in unison.

9. The occupancy sensor according to claim 8, wherein the opposing pairs of movable segments are capable of movement along a single axis.

10. The occupancy sensor according to claim 6, wherein the light sensing element is configured to detect infrared light.

11. The occupancy sensor according to claim 6, the lens comprising a segmented light blocking lens, each segment having a different lens transmittance or focal pattern, and wherein the segmented light blocking lens is rotatable.

12. An overhead occupancy sensor assembly, comprising:
    a housing;
    a lens disposed in the housing;
    a light sensing element disposed behind the lens;
    a light blocking element, the light blocking element being configured to at least partially block light from reaching the sensing element, wherein the light blocking element is a rejection pattern of the lens; and
    an extendable attachment mount coupled to the housing, the extendable attachment mount configured to provide a continuous range-of-motion for positioning the housing with respect to a support fixture.

13. The occupancy sensor assembly according to claim 12, wherein the rejection pattern comprising a coating on or in the lens, a material gradient of the lens, or a Fresnel pattern formed on the lens.

14. The occupancy sensor assembly according to claim 12, wherein the lens comprises multiple regions, a first region having an infrared transmittance or focal pattern different from an infrared transmittance or focal pattern of a second region.

15. The occupancy sensor assembly according to claim 12, wherein an infrared transmittance or focal pattern of the lens is not radially symmetric.

16. The occupancy sensor assembly according to claim 12, wherein the lens is rotatable.

* * * * *